United States Patent
Sakurai

(10) Patent No.: US 11,916,288 B2
(45) Date of Patent: Feb. 27, 2024

(54) ANTENNA MODULE

(71) Applicant: KYOCERA Corporation, Kyoto (JP)

(72) Inventor: Keizou Sakurai, Yasu (JP)

(73) Assignee: Kyocera Corporation, Kyoto (JP)

( * ) Notice: Subject to any disclaimer, the term of this patent is extended or adjusted under 35 U.S.C. 154(b) by 150 days.

(21) Appl. No.: 17/766,281

(22) PCT Filed: Aug. 7, 2020

(86) PCT No.: PCT/JP2020/030397
§ 371 (c)(1),
(2) Date: Apr. 4, 2022

(87) PCT Pub. No.: WO2021/070462
PCT Pub. Date: Apr. 15, 2021

(65) Prior Publication Data
US 2022/0416412 A1   Dec. 29, 2022

(30) Foreign Application Priority Data

Oct. 11, 2019   (JP) .................... 2019-187374

(51) Int. Cl.
*H01Q 1/22* (2006.01)
*H01Q 1/52* (2006.01)
*H01Q 9/04* (2006.01)
*H01Q 21/08* (2006.01)

(52) U.S. Cl.
CPC ............. *H01Q 1/52* (2013.01); *H01Q 1/2283* (2013.01); *H01Q 9/0407* (2013.01); *H01Q 21/08* (2013.01)

(58) Field of Classification Search
CPC ...... H01Q 1/2283; H01Q 23/00; H01Q 1/526; H01Q 9/0407; H01Q 1/241
See application file for complete search history.

(56) References Cited

U.S. PATENT DOCUMENTS

| | | | |
|---|---|---|---|
| 2019/0035749 A1* | 1/2019 | Dalmia | H01Q 1/2283 |
| 2019/0229398 A1* | 7/2019 | Ryoo | H01Q 1/243 |
| 2021/0384609 A1* | 12/2021 | An | H01Q 1/2283 |
| 2022/0271433 A1* | 8/2022 | Ohira | H01P 1/203 |

FOREIGN PATENT DOCUMENTS

JP   2003-309483 A   10/2003

* cited by examiner

*Primary Examiner* — Ricardo I Magallanes
*Assistant Examiner* — Aladdin Abdulbaki
(74) *Attorney, Agent, or Firm* — Volpe Koenig

(57) ABSTRACT

An antenna module according to the present disclosure includes a control substrate including a control circuit, an antenna substrate mounted on the control substrate and including shield through holes and a plurality of first antenna patch conductors disposed side by side when viewed in a plan view, and filters each electrically connected to the shield through holes and including a high-frequency filter and a low-frequency filter. The control substrate or the antenna substrate includes internal antennas at positions each facing one of the plurality of corresponding first antenna patch conductors. When viewed in a plan view, the shield through holes and the filters are located between adjacent ones of the plurality of first antenna patch conductors.

9 Claims, 4 Drawing Sheets

ANTENNA MODULE

TECHNICAL FIELD

The present invention relates to an antenna module.

BACKGROUND ART

A communication device utilizing a wireless network is equipped with an antenna module as described in Patent Document 1, for example, for transmission and reception of an electrical signal.

CITATION LIST

Patent Literature

Patent Document 1: JP 2003-309483 A

SUMMARY

An antenna module according to the present disclosure includes a control substrate including a control circuit, an antenna substrate mounted on the control substrate and including shield through holes and a plurality of first antenna patch conductors disposed side by side when viewed in a plan view, and filters each electrically connected to the shield through holes and including a high-frequency filter and a low-frequency filter. The control substrate or the antenna substrate includes internal antennas at positions each facing one of the plurality of corresponding first antenna patch conductors. When viewed in a plan view, the shield through holes and the filters are located between adjacent ones of the plurality of first antenna patch conductors.

DESCRIPTION OF EMBODIMENTS

As described in Patent Document 1, in the conventional antenna module, a filtering substrate for separating an electrical signal in a necessary frequency band and an electrical signal in an unnecessary frequency band from each other is connected to a surface of a control substrate including a control circuit. In other words, a filtering substrate is further present between an antenna substrate including an antenna circuit and the control substrate, and the number of layers of the substrate is large, so that a structure is bulky and complicated. Thus, for example, miniaturization of the communication device is prevented.

In an antenna module according to the present disclosure, the antenna substrate is mounted on the surface of the control substrate, and the filtering substrate is not present between the antenna substrate and the control substrate. Thus, the antenna module according to the present disclosure has a small number of layers of the substrate and can avoid multilayering, thus having a simple structure.

Figure 1:
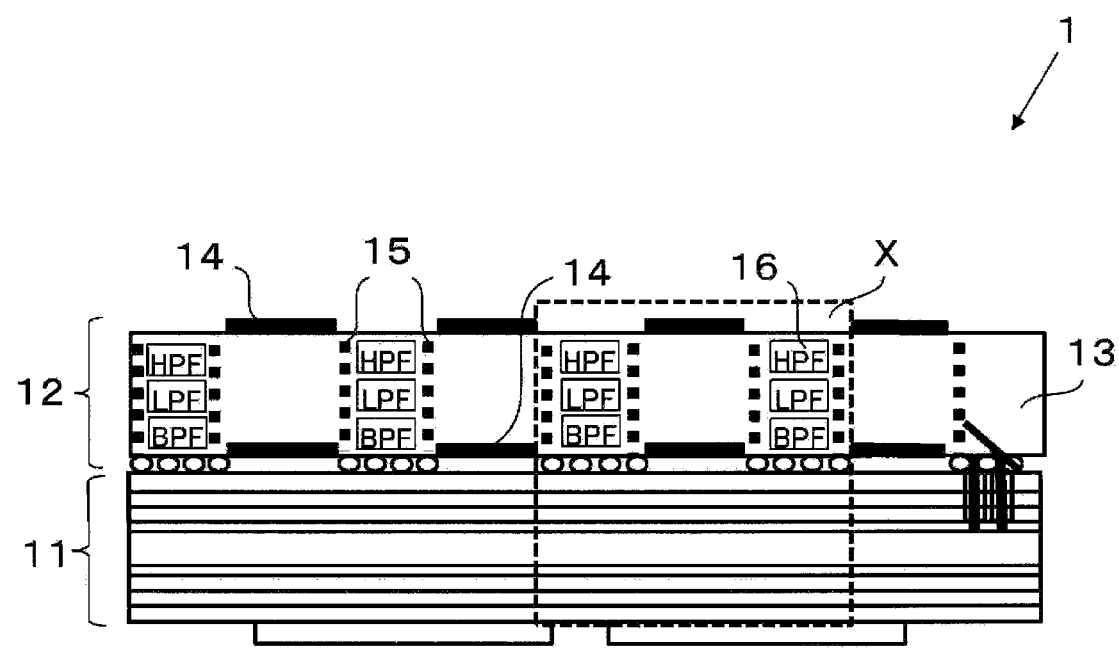
FIG. 1 is an explanatory view illustrating an antenna module according to a first embodiment of a present disclosure.
Figure 2:
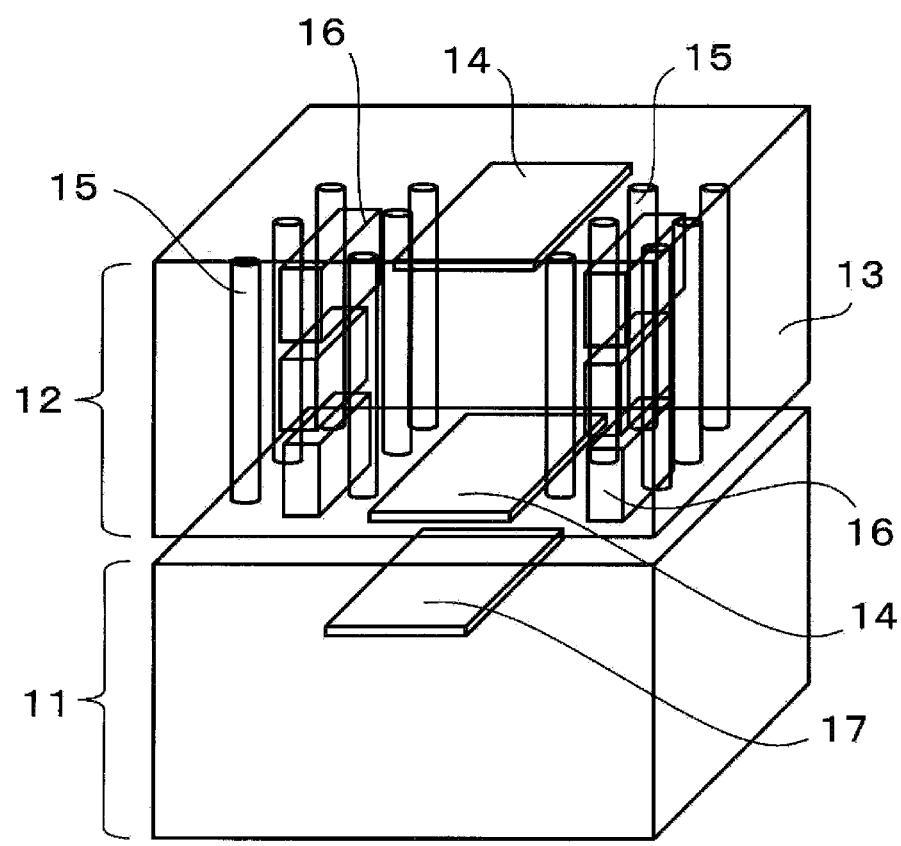
FIG. 2 is a perspective view of a region X illustrated in FIG. 1.

An antenna module according to a first embodiment of the present disclosure will be described with reference to FIGS. 1 and 2. FIG. 1 is an explanatory view illustrating an antenna module 1 according to the first embodiment of the present disclosure. The antenna module 1 according to the first embodiment includes a control substrate 11 and an antenna substrate 12.

The control substrate 11 includes a control circuit and is used for controlling intensity of electromagnetic waves. Although not illustrated in detail in FIG. 1, the control substrate 11 has, for example, a build-up structure in which insulating layers and wiring conductor layers are alternately laminated.

The insulating layers are not particularly limited as long as the insulating layers are formed of a material having an insulating property. Examples of the material having an insulating property include resins such as an epoxy resin, a bismaleimide-triazine resin, a polyimide resin, and a polyphenylene ether resin. Two or more of these resins may be mixed and used.

The insulating layers may contain a reinforcing material. Examples of the reinforcing material include insulating fabric materials such as glass fiber, glass non-woven fabric, aramid non-woven fabric, aramid fiber, and polyester fiber. Two or more types of reinforcing materials may be used in combination. Further, inorganic insulating fillers made of, for example, silica, barium sulfate, talc, clay, glass, calcium carbonate, or titanium oxide may be dispersed in the insulating layers.

No particular limitation is applied to the wiring conductor layers, provided that they are made out of a material having electrical conductivity. Examples of the material having electrical conductivity include metals such as copper. Specifically, the wiring conductor layer is formed of a metal foil such as a copper foil or metal plating such as copper plating. Furthermore, as illustrated in FIG. 2, the control substrate 11 is provided with an internal antenna 17. As illustrated in FIG. 2, the control substrate 11 is provided with the internal antenna 17, and thus the bandwidth of the electromagnetic waves used can be widened.

The antenna substrate 12 is electrically connected to the control substrate 11 on the surface of the control substrate 11. The antenna substrate 12 includes an insulating layer 13, antenna patch conductors 14, shield through holes 15, and filters 16.

No particular limitation is applied to the insulating layer 13, provided that it is made out of a material having an insulating property. Examples of material having an insulating property include a fluororesin, a liquid crystal polymer, and the resins described above. As necessary, the insulating layer 13 may also contain the reinforcing material described above, or the inorganic insulating fillers may be dispersed.

The antenna patch conductors 14 are provided to receive and transmit the electromagnetic waves. When the antenna substrate 12 is viewed in a plan view, a plurality of the antenna patch conductors 14 are provided vertically and horizontally. The plurality of antenna patch conductors 14 are typically aligned at equal intervals.

In the antenna substrate 12, each of the plurality of antenna patch conductors 14 are provided at positions facing each other on an upper and a lower surface of the insulating layer 13. In the present specification, for convenience, the antenna patch conductors 14 located on the upper surface of the insulating layer 13 are "first antenna patch conductors" and the antenna patch conductors 14 located on the lower surface of the insulating layer 13 are "second antenna patch conductors". No particular limitation is applied to the antenna patch conductors 14, provided that those are made out of a material having electrical conductivity. Similar to the wiring conductor layer described above, examples of such a material include metals such as copper.

When the antenna substrate 12 is viewed in a plan view, the shield through holes 15 are formed between adjacent ones of the antenna patch conductors 14. The shield through holes 15 are ground through holes, and reduce an influence on the filter circuit due to electromagnetic waves and an influence on electromagnetic waves of transmission and reception due to electromagnetic waves from the filter circuit.

The shield through holes 15 are formed along the periphery of the antenna patch conductor 14. In FIG. 2, the shield through holes 15 are illustrated to be along only two sides of the antenna patch conductor 14, but in practice the shield through holes 15 are located along the remaining two sides.

In the antenna substrate 12, the filters 16 are embedded in the antenna substrate 12 (insulating layer 13), and are provided so as to be sandwiched between the shield through holes 15. The filters 16 separate electromagnetic waves in a necessary frequency band and electromagnetic waves in an unnecessary frequency band among the electromagnetic waves received by the antenna patch conductors 14 or the electromagnetic waves transmitted from the antenna patch conductors 14.

Each of the filters 16 may include at least a high frequency filter (HPF) and a low frequency filter (LPF). In a case where the HPF and the LPF are included, the electromagnetic waves in a high-frequency band and the electromagnetic waves in a low-frequency band can be removed. Each of the filters 16 illustrated in FIG. 1 includes a band-pass filter (BPF) in addition to the HPF and the LPF.

In the antenna module 1 according to the first embodiment, for example, the electromagnetic waves received by the antenna patch conductors 14 (first antenna patch conductors) are transmitted to the internal antenna 17 provided in the control substrate 11, via the antenna patch conductors 14 (second antenna patch conductors), each provided at a position facing one corresponding first antenna patch conductor. The electromagnetic waves transmitted to the internal antenna 17 are then transmitted to the filters 16 through the signal conductor. The electromagnetic waves transmitted to the filters 16 are separated into the electromagnetic waves in the necessary frequency band and the electromagnetic waves in the unnecessary frequency band. The electromagnetic waves in the necessary frequency band are transmitted to the control circuit provided in the control substrate 11. On the other hand, the electromagnetic waves in the unnecessary frequency band are transmitted to, for example, a ground layer formed on the control substrate 11 to be emitted outside the antenna module 1.

In the antenna module 1 according to the first embodiment, the filters 16 are embedded in the antenna substrate 12. Thus, there is no further substrate including the filters 16 in the antenna module 1 according to the first embodiment.

Thus, the antenna module 1 according to the first embodiment can avoid multilayering thus having a simple structure, and can also contribute to miniaturization of the communication device.

Figure 3A:
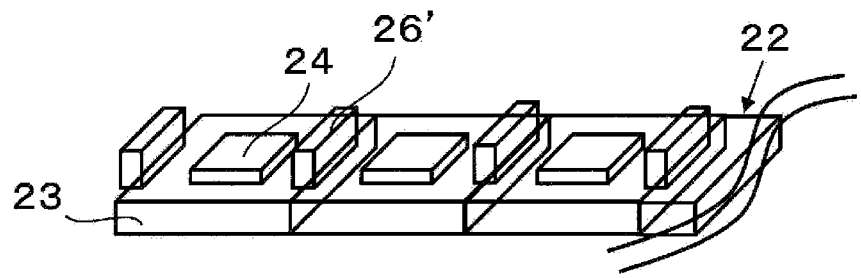
FIG. 3(A) is a schematic view illustrating an antenna substrate provided in an antenna module according to a second embodiment of the present disclosure.
Figure 3B:
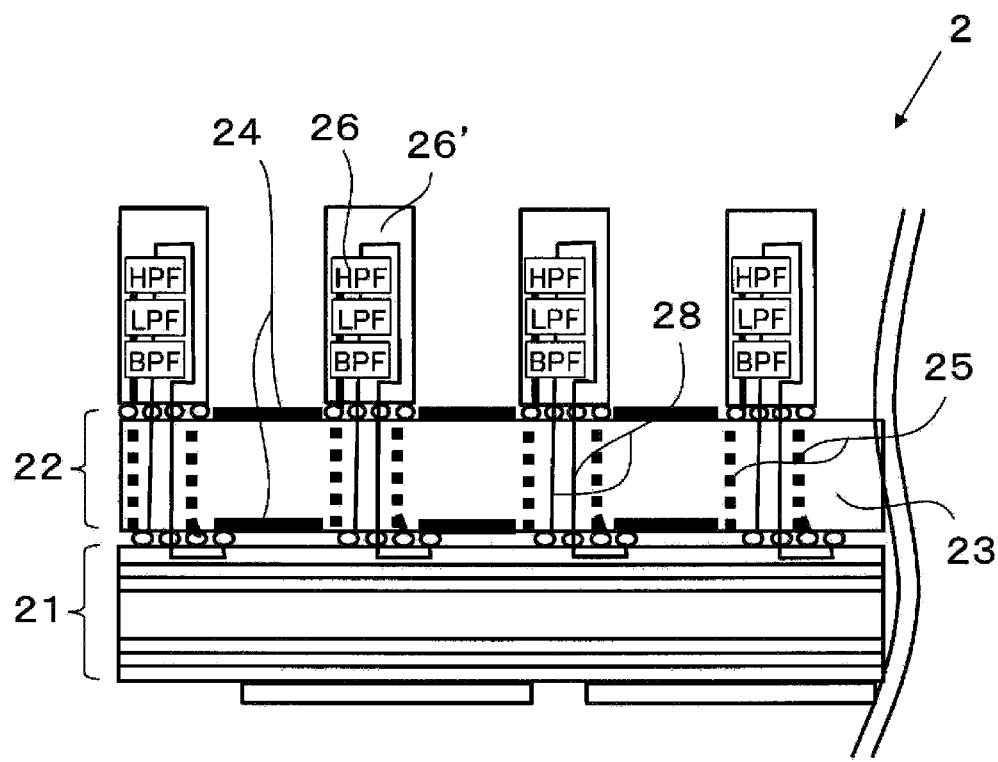
FIG. 3(B) is an explanatory view illustrating the antenna module according to the second embodiment of the present disclosure.

Next, the antenna module according to a second embodiment of the present disclosure will be described with reference to FIG. 3. FIG. 3(A) is a schematic diagram illustrating an antenna substrate 22 provided in an antenna module 2 according to the second embodiment of the present disclosure. FIG. 3(B) is an explanatory view illustrating the antenna module 2 according to the second embodiment of the present disclosure.

The antenna module 2 according to the second embodiment differs from the antenna module 1 according to the first embodiment in the position of the filters. In the antenna module 1 according to the first embodiment, as described above, the filters 16 are embedded in the antenna substrate 12. On the other hand, in the antenna module 2 according to the second embodiment, filters 26 are located on the surface of the antenna substrate 22 and are not embedded in an insulating layer 23. In other words, in the antenna module 2 according to the second embodiment, members 26', each including one corresponding filter 26, are located on the surface of the antenna substrate 22 so as to surround antenna patch conductors 24.

Even when the filters 26 are provided on the surface of the antenna substrate 22, as described above, the electromagnetic waves in the necessary frequency band and the electromagnetic waves in the unnecessary frequency band can be separated from each other. In the antenna module 2 according to the second embodiment, for example, the electromagnetic waves received by the antenna patch conductors 24 (first antenna patch conductors) are transmitted to the internal antenna provided in a control substrate 21, via the antenna patch conductors 24 (second antenna patch conductors), each provided at a position facing one corresponding first antenna patch conductor.

The electromagnetic waves transmitted to the internal antennas are then transmitted to the filters 26 through signal through holes 28 located in the antenna substrate 22. The electromagnetic waves transmitted to the filters 26 are separated into the electromagnetic waves in the necessary frequency band and the electromagnetic waves in the unnecessary frequency band. The electromagnetic waves in the necessary frequency band are transmitted to the control circuit provided in the control substrate 21 through the signal through holes 28. On the other hand, the electromagnetic waves in the unnecessary frequency band are transmitted to, for example, a ground layer formed on the control substrate 21 to be emitted outside the antenna module 2.

In the antenna module 2 according to the second embodiment, the members 26', each including one corresponding filter 26, are mounted on the surface of the antenna substrate 22. Thus, the members 26' reduce mixing of the electromagnetic waves between the antenna patch conductors 24 on the surface of the antenna substrate 22. Furthermore, there is no further substrate including the filters. Thus, the antenna module 2 according to the second embodiment can avoid multilayering thus having a simple structure, and can also contribute to miniaturization of the communication device.

The control substrate 21, the insulating layer 23, the antenna patch conductors 24, and shield through holes 25 included in the antenna module 2 according to the second embodiment are the same as those described for the control substrates 11. the insulating layer 13, the antenna patch conductors 14, and the shield through holes 15 included in the antenna module 1 according to the first embodiment described above. Thus, a detailed description will be omitted.

Figure 4A:
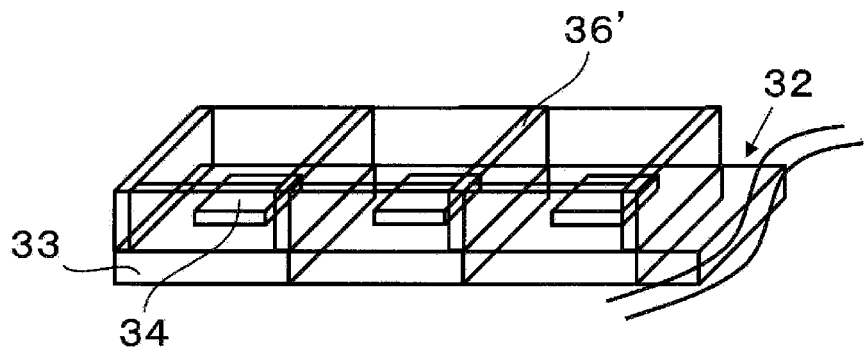
FIG. 4(A) is a schematic view illustrating an antenna substrate provided in an antenna module according to a third embodiment of the present disclosure.
Figure 4B:
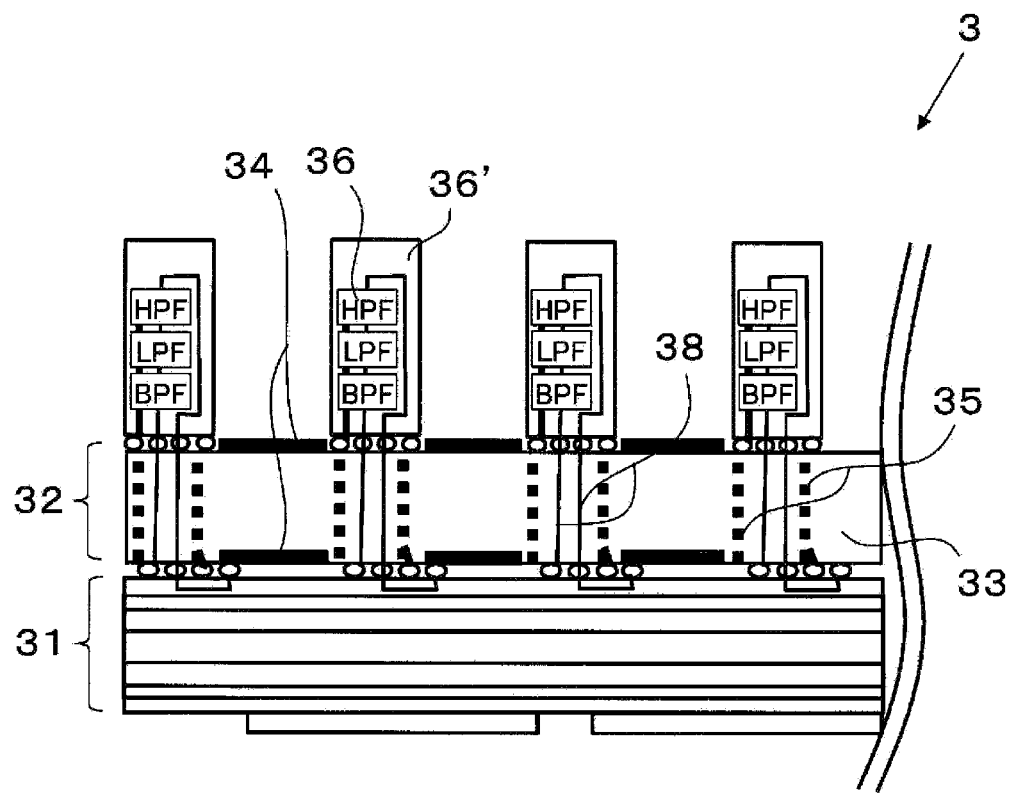
FIG. 4(B) is an explanatory view illustrating the antenna module according to the third embodiment of the present disclosure.

Next, the antenna module according to a third embodiment of the present disclosure will be described with reference to FIG. 4. FIG. 4(A) is a schematic diagram illustrating an antenna substrate 32 provided in an antenna module 3 according to the third embodiment of the present disclosure. FIG. 4(B) is an explanatory view illustrating the antenna module 3 according to the third embodiment of the present disclosure.

Similar to the antenna module 2 according to the second embodiment, in the antenna module 3 according to the third embodiment, filters 36 are provided on a surface of the antenna substrate 32. However, in the antenna module 2 according to the second embodiment, the filters 26 are mounted as the members 26', whereas in the antenna module 3 according to the third embodiment, antenna patch conductors 34 are surrounded by frame bodies 36', each housing one corresponding filter 36 inside.

A material of the frame bodies 36', each housing one corresponding filter 36 inside. is not particularly limited. Examples of a material of the frame bodies 36' include resins such as an epoxy resin, a bismaleimide-triazine resin, a polyimide resin, a polyphenylene ether resin, a fluororesin, and a liquid crystal polymer. Two or more of these resins may be mixed and used.

By providing the frame bodies 36' on the surface of the antenna substrate 32 in this manner, it is possible to reduce warp and deformation of the antenna module 3 due to a difference in a coefficient of thermal expansion between the antenna substrate 32 and control substrate 31. In other words, the frame bodies 36' improve rigidity of the antenna module. Furthermore, there is no further substrate including the filters. Thus, the antenna module 3 according to the third embodiment has a simple structure, and can also contribute to miniaturization of the communication device.

Furthermore, at least an outer surface and an inner surface of each of the frame bodies 36' housing one corresponding filter 36 inside may be covered with a metal film. At least the outer surface and the inner surface of each of the frame bodies 36' is covered with the metal film, and thus a function as a waveguide can be imparted to each of the frame bodies 36'. Examples of the metal film include a film such as copper, gold, and aluminum. A method for forming the metal film is not limited, and for example, the metal film may be formed by plating, or may be formed by affixing a metal foil. Furthermore, an upper end surface of the frame bodies 36' may be covered with the metal film.

The control substrate 31, insulating layer 33, the antenna patch conductors 34, and shield through holes 35 included in the antenna module 3 according to the third embodiment are the same as those described for the control substrates 11, the insulating layer 13, the antenna patch conductors 14, and the shield through holes 15 included in the antenna module 1 according to the first embodiment described above. Signal through holes 38 included in the antenna module 3 according to the third embodiment are the same as those described for the signal through holes 28 included in the antenna module 2 according to the second embodiment described above. Thus, a detailed description will be omitted.

The antenna module according to the present disclosure is not limited to the embodiment and the other embodiments described above. In the embodiment described above, each internal antenna 17 is provided in the control substrate 11. However, the internal antennas may be provided within the antenna substrate. In this case, only the first antenna patch conductors described above are provided as the antenna patch conductors, and the internal antennas are provided instead of the second antenna patch conductors.

There may be a plurality of the embodiments described above within one antenna module. In this case, it is advantageous in that one antenna module can have transmission and reception characteristics of the electromagnetic waves in each embodiment.

Furthermore, in the antenna module according to the present disclosure, in order to further reduce the warp, the metal frame (stiffener) may be provided on a lower surface of the control substrate. Examples of the metal frame include a frame such as copper, a 42 alloy, cobalt, stainless steel, and aluminum.

REFERENCE SIGNS LIST 1, 2, 3 Antenna module
11, 21, 31 Control substrate
12, 22, 32 Antenna substrate
13, 23, 33 Insulating layer
14, 24, 34 Antenna patch conductor
15, 25, 35 Shield through hole
16, 26, 36 Filter
17 Internal antenna
28, 38 Signal through hole

The invention claimed is:

1. An antenna module comprising:
   a control substrate comprising a control circuit;
   an antenna substrate mounted on the control substrate and comprising shield through holes and a plurality of first antenna patch conductors disposed side by side when viewed in a plan view; and
   filters each electrically connected to the shield through holes and comprising a high-frequency filter and a low-frequency filter,
   wherein the control substrate or the antenna substrate comprises internal antennas each disposed at a position facing one of the plurality of corresponding first antenna patch conductors, and
   the shield through holes and the filters are located between adjacent ones of the plurality of first antenna patch conductors when viewed in a plan view.

2. The antenna module according to claim 1,
   wherein the filters are located within the antenna substrate, and are sandwiched between the shield through holes.

3. The antenna module according to claim 2,
   wherein the plurality of first antenna patch conductors are located above the filters and the shield through holes.

4. The antenna module according to claim 1,
   wherein the filters are located on the antenna substrate.

5. The antenna module according to claim 4,
   wherein the filters are located above the shield through holes.

6. The antenna module according to claim 1, further comprising:
   frame bodies, on the antenna substrate, configured to surround and separate the plurality of first antenna patch conductors from each other,
   wherein the filters are housed inside the frame bodies.

7. The antenna module according to claim 6,
   wherein each of the frame bodies comprises an outer surface located outward and an inner surface located to surround one of the plurality of corresponding first antenna patch conductors, and at least the outer surface and the inner surface are covered with a metal film.

8. The antenna module according to claim 1, wherein the internal antennas are located within the control substrate, and the antenna substrate further comprises a plurality of second antenna patch conductors each disposed at a position facing one of the plurality of corresponding first antenna patch conductors.

9. The antenna module according to claim 8, wherein the shield through holes and the filters are located between adjacent ones of the plurality of second antenna patch conductors when viewed in a plan view.

\* \* \* \* \*